313-414 SR

7/11/78 XR 4,100,450

United States Patent [19]

Frutiger et al.

[11] 4,100,450

[45] Jul. 11, 1978

[54] METHOD OF AND APPARATUS FOR GENERATING LONGITUDINAL STRIPS OF ENERGETIC ELECTRON BEAMS

[75] Inventors: William A. Frutiger; David E. Overberg, both of Beverly, Mass.

[73] Assignee: Energy Sciences Inc., Bedford, Mass.

[21] Appl. No.: 769,535

[22] Filed: Feb. 17, 1977

[51] Int. Cl.$^2$ ........................ H03J 33/02; H05H 7/06

[52] U.S. Cl. .................................... 313/360; 313/299; 313/300; 313/411; 313/414; 313/420

[58] Field of Search ................ 328/233; 313/360, 411, 313/414, 420, 296, 297, 299, 300

[56] References Cited

U.S. PATENT DOCUMENTS

| | | | |
|---|---|---|---|
| 3,514,664 | 5/1970 | McCann | 313/297 X |
| 3,780,334 | 12/1973 | Leboutet | 313/420 X |

*Primary Examiner*—Siegfried H. Grimm
*Attorney, Agent, or Firm*—Rines and Rines, Shapiro and Shapiro

[57] ABSTRACT

This disclosure deals with novel techniques for generating longitudinal strips of energetic electron beams through concentric slotted constructions, being quite adaptable for the generation of multiple beams in different directions that are of very narrow angular transverse extent, as for purposes of line irradiation of articles passing the beams, though the techniques herein disclosed are also useful in other applications of electron beam irradiation.

12 Claims, 3 Drawing Figures

Figure 3:
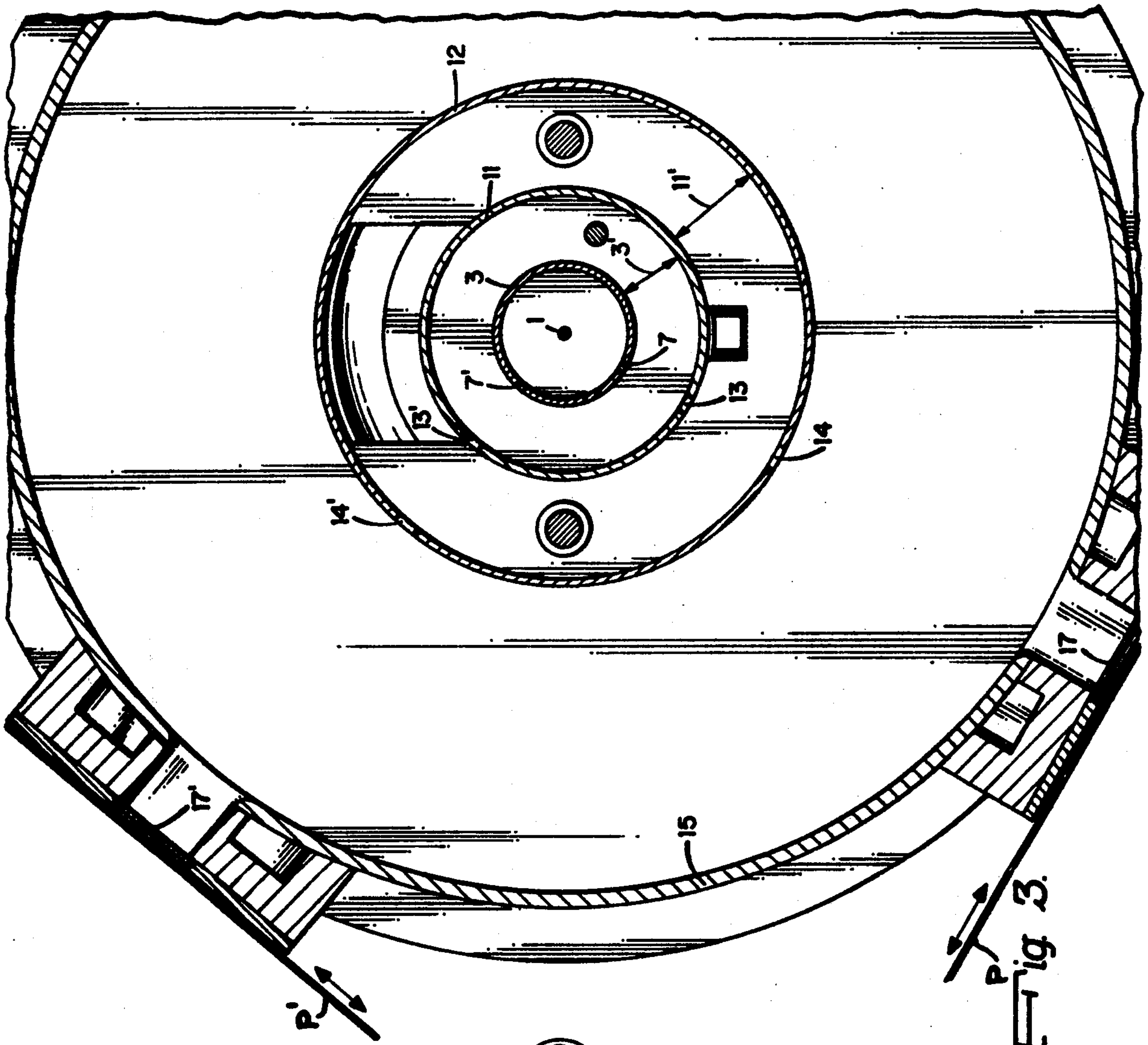

METHOD OF AND APPARATUS FOR GENERATING LONGITUDINAL STRIPS OF ENERGETIC ELECTRON BEAMS

The present invention relates to methods of and apparatus for generating energetic electrons for irradiation and similar purposes such as, for example, the sterilization of surfaces or the irradiation treatment of articles moved relatively in and out of the electron beam; the invention being, however, particularly directed to the generation of longitudinal strips or "curtains" of such electron beams.

There are described in earlier U.S. Pat. Nos. 3,702,412 and 3,769,600 electron beam generators that enable the production of longitudinal strips or "curtains" of uniform energetic electron beams for irradiation purposes and the like. These are particularly useful in industrial processes such as the sterilization of materials drawn by the electron generator windows, polymerization and curing of various coatings and the like, and other growing industrial and related applications. The use of such electron beam strips in place of scanning point or conical beams has advantages in many applications, including those concerned with uniformity and high line speeds where webs of material or products are to pass under the irradiation source. There are occasions in such and related applications where it is necessary to generate very fine or narrow electron beam strips and, also, where it is economically important or otherwise advantageous to provide strips emanating at different angles along different directions for enabling multiple irradiation processing in a single pass of a sheet or other web material or the like, or effecting some other simultaneous irradiation process or result.

It is in connection with applications of this character that the present invention is particularly directed, though there are broader applications as well; the invention providing an improved technique and apparatus that can enable not only multiple direction simultaneous irradiation from the same electron source, but can effect a high degree of control over the resulting width or transverse angle of the electron beam strips emanating from the generator.

An object of the invention, accordingly, is to provide a new and improved method of and apparatus for energetic electron beam strip generation and irradiation that enable multiple uniform strips to be simultaneously produced and directed in multiple directions and, where desired, enable a high and fine degree of control over the narrowness of the strip for fine line irradiation purposes and the like.

A further object is to provide such improved method and apparatus that may be more generally applicable in other types of electron generators wherein the advantages attainable herein may be sought.

Other and further objects will be explained hereinafter and are more particularly delineated in the appended claims.

In summary, the invention, from one of its important viewpoints, relates to a method of and apparatus for generating a longitudinal strip of energetic electrons that, in a preferred construction, combine a longitudinal extending electron emitting cathode with a plurality of conductive longitudinal extending cylindrical means mounted substantially coaxially with the cathode and concentrically disposed thereabout at successive spaced radial separations therefrom, each being provided with narrow longitudinal slot means substantially radially aligned with one another. A positive potential is applied to the innermost of the cylindrical means to control the extraction of electrons from the cathode and their egress as a longitudinal electron beam strip through the narrow slot means of the innermost cylindrical means. All of this is disposed within an evacuated housing means which surrounds said plurality of cylindrical means and is provided with electron-pervious window means substantially radially aligned with said slot means, and means for establishing accelerating voltage fields between the outermost of the cylindrical means and the housing window means. Means is provided for electrically connecting the cylindrical means together and relatively separating the same to provide not only electrostatic shielding but aperture lens-focusing for converging the electron beam strip through the slot means of the said outermost of the cylindrical means into said accelerating field. Preferred constructional details and method steps are hereinafter set forth.

Figure 1:
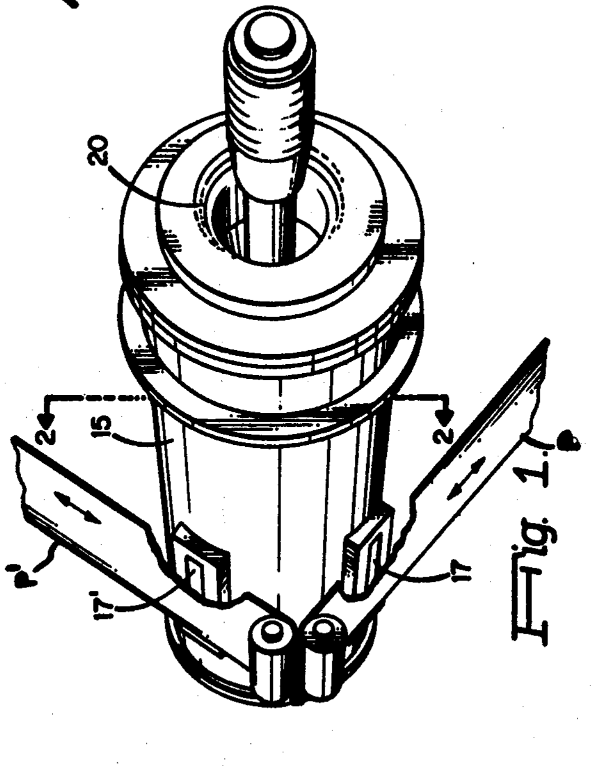
Figure 2:
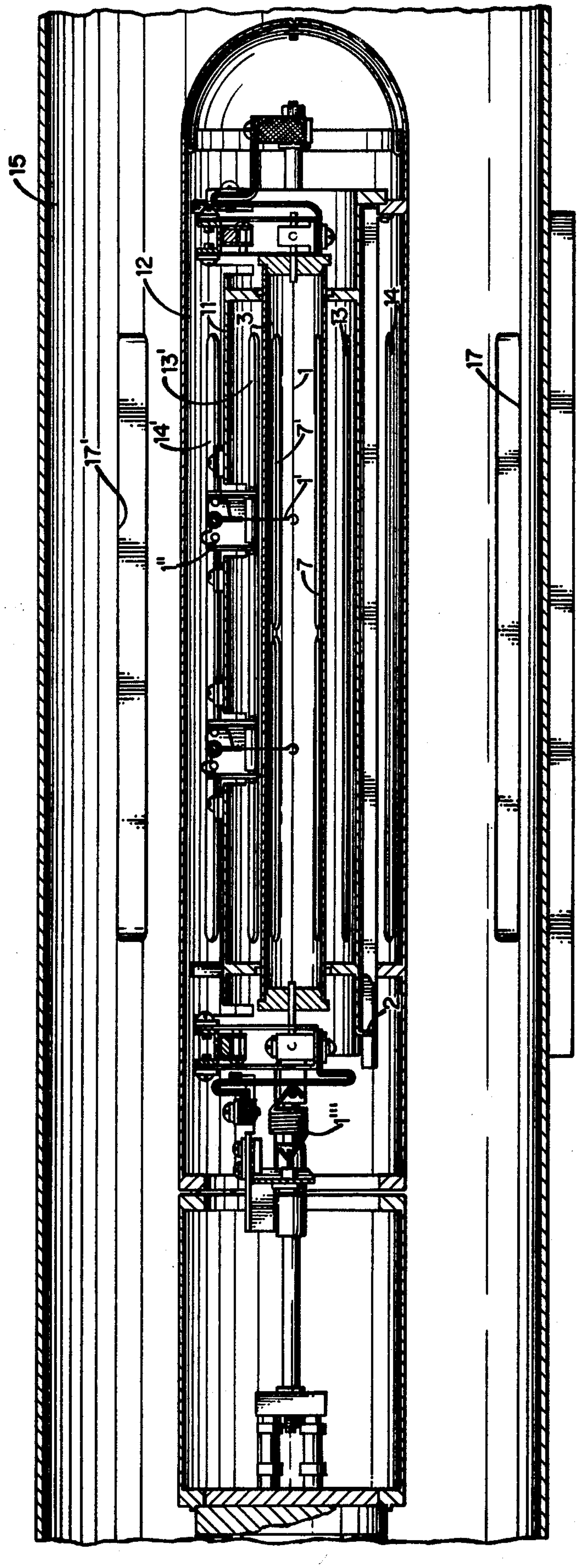

The invention will now be described in connection with the accompanying drawing FIG. 1 of which is an isometric external view of the apparatus of the invention in use with a pair of irradiation zones;

FIG. 2 is a longitudinal section upon a somewhat larger scale taken along the line 2—2 of FIG. 1, looking in the direction of the arrows; and FIG. 3 is a transverse section, greatly enlarged.

Referring to FIGS. 1 and 2, the preferred construction underlying the invention embodies a longitudinally extending cathode 1 which is preferably, though not essentially, of the filament type, directly or indirectly heated, being shown in this instance as directly heated. Such structures are described in the said patents and are used to generate a longitudinal line of electrons along the cathode 1 which are emitted in all transverse radial directions.

Coaxially surrounding the cathode 1 and concentrically disposed thereabout at successive spaced radial separations therefrom, are three conductive cylinders shown at 3, 11, and 12, the innermost cylinder 3 of which is illustrated as provided with a pair of narrow longitudinal slots or apertures 7 and 7′ which are oriented at selected angles along the circumference thereof—in this case, subtending therebetween an angular circumferential arc of about 100° for a purpose hereinafter delineated. The intermediate cylinder 11 is similarly provided with a pair of somewhat wider corresponding slots 13 and 13′; and the outermost cylindrical member 12 is provided with a pair of further slots 14 and 14′, all the corresponding slots being substantially radially aligned to enable the electron beams to pass successively therethrough as later explained.

A positive potential, generally of the order of 60 volts, is applied between the cathode 1 and the first coaxially disposed longitudinal cylindrical member 3 such that the latter may serve as a space charge-limiting control electrode causing the electrons that are emitted by the cathode 1 to be drawn toward the cylinder 3. The only regions in which these electrons may pass through the control cylinder 3, however, are at the narrow slots 7 and 7′, with the electrons emitted in other radial angles being suppressed from egress by virtue of the opaque walls of the cylinder 3. The electrons that are extracted through the narrow longitudinal slots 7 and 7′ proceed into the evacuated space between the innermost cylindrical member 3 and the intermediate cylinder 11, and in turn pass through the correspondingly aligned slots 13 and 13′ and into the evacuated region between the cylinder 11 and the outermost terminal cylinder 12. Through appropriate spacing of these cylindrical members, preferably with the cylinder 11 substantially mid-way between the control cylinder 3 and the terminal cylinder 12, and by electrically connecting the cylinders 3 and 11, as by a conductive support schematically illustrated at 3', and the cylinders 11 and 12, as by a further conductive support schematically shown at 11', these cylinders will enable a deep shielding of the cathode structure from the actual accelerating gap that is produced between the cylinder 12 and the ultimate outer housing 15 containing all of the apparatus and to which the positive high-voltage accelerating electric field potential (not shown) is applied, with the negative terminal thereof being connected to the outermost terminal cylindrical member 12.

It has been found in prior coaxial structures of this character, however, that there can be an inadvertent turning-on of the cathode 1 by extraneous fields, which is deleterious and highly undesired in many applications. Through the utilization of the particular above-described electrostatic shielding and other deep-shielding effect of the members 11 and 12 with appropriate apertures, such unwanted effects have been completely eliminated in practice.

More than this, moreover, the structure of the invention has been found capable of simultaneously enabling a final slot or aperture lens-focusing effect to be produced which can exert a much desired fine control on the ultimate angle or transverse spread of the strip beam that is to be accelerated in the gap between cylinders 12 and 15 and ultimately emitted through the correspondingly aligned windows 17 and 17' of electron-pervious material, such as aluminum or the like, in order to impinge upon the work products P, P' that are to be irradiated in the regions there-beyond.

Specifically, through the before-described appropriate relative separation and size of the aligned cylinder apertures, it has been found that the terminal cylinder 12 may permit the field lines in the adjacent accelerating gap to penetrate deeply into the slots and serve as a magnetic lens structure for causing the diverging beam strip that has egressed from the aperture 7 of the control cylinder 3 and has passed through the aperture 13 in the innner cylinder 11, to become converged or refocused back so as to pass through the aperture 14; the same remarks applying with regard to the other beam egress systems 7', 13', 14'. This deep focusing provides a means of controlling and determining the ultimate expansion angularly transversely of the electron strip in the accelerating gap, and thus enables a fine control upon the ultimate narrow or other beam width that may be desired at the windows 17 and 17'.

With such a structure and its accompanying phenomenon of operation, it has been found possible to control the beam strips to the order of a few degrees—say the order of 3°—at the windows 17 and 17'. The windows may themselves subtend a window width of a few degrees of angle, perhaps twice that of the beam, such as about 6°. This would obtain, for exmple, in a structure where the cylinders are separated from one to two inches or so from one another as, for example, with a 1-inch diameter cylinder 3, a 3 ½-inch diameter cylinder 12, an intermediate cylinder 11 about mid-way therebetween, and an ultimate housing 15 of about 8 inches. The windows 17 and 17' may then have a width of about a centimeter. For such purposes the slots 14 and 14' may be of the order of an eighth of an inch, and the slots 13 and 13' of the order of 0.025 inches, with the slots 7 and 7' of the order of 0.093 inches.

It will be noted that the slots 7, 7' 13, 13' and 14, 14', FIGS. 2 and 3, are shown without grids provided therein as has heretofore been customary in electron tube devices. It has been found that through this utilization of the narrow slots with the deep shielding effects of the plurality of nested cylindrical devices, such grid structures are not only not necessary, but are better elimated in many instances where fine control on the narrow beam angle is desired; the aperture lens-focusing phenomenon providing a most effective technique in such applications. This is not, however, to forbid the use of grids in one or more of the slots in the cylinders, except that for the particular purposes of the multiple-beam narrow beam sytem preferred herein, the unencumbered slots are preferred and more effective.

The method and apparatus of the invention may thus be used to effect simultaneous multiple narrow strip or curtain irradiation as, for example, where multiple webs of paper P, P' or the like that are to be sterilized may be passed by the respective windows 17 and 17', FIG. 1, such as in forming a carton or container or for any other purposes requiring similar characteristics.

While the invention has been illustrated in connection with two narrow energetic electron strips, it will be understood that more than two beams may be produced and, indeed, that some of the techniques here-involved may even be used for single beam purposes. An important problem in the multiple-beam utilization is to insure that there is uniformity of electron densities along the complete strips at the multiple windows 17 and 17' and that substantially the same number of electrons are emitted in the narrow angle passing through the slots 7, 13, 14 as through the slots 7', 13', 14'. To obtain this uniformity and equally efficient use of the different small angular sectors of the cathode 1, the before-described open aperture slot technique of shielding, deep field penetration shielding, and final aperture lens-focusing action has been found to provide remarkable uniformity of result in the multiple directions.

In order further to assure this result, resilient hangers may be provided as at 1', FIG. 2, carrying the filamentary cathode 1 at intermediate regions and supported from mountings attached to the cylinder 11, as with the aid of further restoring spring structures (shown at 1") that prevent dislocation in transit or actual installation. Further to this end, a tension spring device 1''' is shown provided external to the cylinder cathode 3 to enable the adjustment of longitudinal tension on the cathode 1 after the same is installed, as illustrated in FIG. 2. The assembly 1-3-11 is inserted as a unit in the left-hand or open end of the cylinder 12 and is accurately positioned and aligned with the help of a tab 2 and alignment pins and receiving apertures, the cylinder being closed off by the high voltage bushing assembly 20, FIG. 1, which is also prearranged in a plug fitting alignment system so that the assembled parts are in the proper orientation, these then being inserted again within the housing in proper orientation of alignment with the windows 17 and 17'.

Further modification will occur to those skilled in this art and all such are considered to fall within the spirit and scope of the invention as defined in the appended claims.

What is claimed is:

1. Apparatus for generating a longitudinal strip of energetic electrons having, in combination, a longitudinally extending electron-emitting cathode; a plurality of conductive longitudinally extending cylindrical means mounted substantially coaxially with the cathode and concentrically disposed thereabout at successive spaced radial separations therefrom, each being provided with narrow longitudinal slot means substantially radially aligned with one another; means for applying a positive potential to the innermost of the cylindrical means to control the extraction of electrons from the cathode and their egress as a longitudinal electron beam strip through the narrow slot means of the innermost cylindrical means; evacuated housing means surrounding said plurality of cylindrical means and provided with electron-pervious window means substantially radially aligned with said slot means and means for establishing an accelerating-voltage field between the outermost of the cylindrical means and the housing window means; and means for electrically connecting said cylindrical means together and relatively separating the same to provide not only electrostatic shielding but aperture lens-focusing for converging the electron beam strip through the slot means of the said outermost of the cylindrical means into said accelerating field.

2. Apparatus as claimed in claim 1 and in which said plurality of cylindrical means comprises three concentric conductive cylinders the intermediate cylinder of which is disposed substantially mid-way between the said innermost and outermost cylinder means.

3. Apparatus as claimed in claim 1 and in which the slot means of each of said cylindrical means comprises a pair of narrow slots, and said window means comprises a pair of windows substantially radially aligned therewith.

4. Apparatus as claimed in claim 3 and in which the slots and corresponding windows are circumferentially spaced.

5. Apparatus as claimed in claim 4 and in which the circumferential arc between said pair of windows is adjusted to the order of 100°.

6. Apparatus as claimed in claim 4 and in which the radial angle subtended by each window is of the order of a few degrees.

7. Apparatus as claimed in claim 6 and in which the radial angle transversely subtended by each electron beam strip as it impinges on its corresponding window is of the order of a few degrees, but less than the radial angle subtended by each window.

8. Apparatus as claimed in claim 7 and in which the said radial angle subtended by each electron beam is substantially half that of the radial angle subtended by each window.

9. Apparatus as claimed in claim 1 and in which the cathode comprises a longitudinal filament provided with distortion-preventing resilient hanger means intermediately supporting the same and suspended from one of said cylindrical means.

10. Apparatus as claimed in claim 9 and in which spring means is provided external to one end of said innermost cylindrical means, connected to enable adjustment of the cathode filament tension.

11. Apparatus as claimed in claim 1 and in which said outermost cylindrical means is originally open at one end to receive the other of said cylindrical means and the cathode, and high-voltage bushing means is provided for closing said one end, with aligned pins and apertures provided to enable precise relative positioning.

12. Apparatus as claimed in claim 1 and in which the spacing of the successive of said cylindrical means from one another is of the order of one to a few inches.

* * * * *